(12) United States Patent
Dunne

(10) Patent No.: US 9,400,326 B2
(45) Date of Patent: Jul. 26, 2016

(54) NON-SATURATING RECEIVER DESIGN AND CLAMPING STRUCTURE FOR HIGH POWER LASER BASED RANGEFINDING INSTRUMENTS

(71) Applicants: LASER TECHNOLOGY, INC., Centennial, CO (US); KAMA-TECH (HK) LIMITED, Tsim Sha Tsui (CN)

(72) Inventor: Jeremy G. Dunne, Parker, CO (US)

(73) Assignees: Laser Technology, Inc., Centennial, CO (US); Kama-Tech (HK) Limited, Tsim Sha Tsui (CN)

( * ) Notice: Subject to any disclaimer, the term of this patent is extended or adjusted under 35 U.S.C. 154(b) by 0 days.

(21) Appl. No.: 14/838,130

(22) Filed: Aug. 27, 2015

(65) Prior Publication Data
US 2016/0033627 A1 Feb. 4, 2016

Related U.S. Application Data

(62) Division of application No. 13/267,395, filed on Oct. 6, 2011, now Pat. No. 9,151,604.

(51) Int. Cl.
*G01C 3/08* (2006.01)
*H03F 3/16* (2006.01)
(Continued)

(52) U.S. Cl.
CPC . *G01S 7/486* (2013.01); *G01C 3/08* (2013.01); *G01S 7/481* (2013.01); *G01S 7/4861* (2013.01);
(Continued)

(58) Field of Classification Search
CPC ............ H03F 1/34; H03F 1/342; H03F 3/04; H03F 3/08; H03F 3/082; H03F 3/16; H03F 3/165; H03F 3/45085; H03F 3/45475; H03F 3/4508; H03F 3/45076; H03F 3/45071; G01S 7/486; G01S 7/4861; G01S 7/4863; G01S 7/4868; G01S 7/481; G01S 17/10; F41G 3/06; F41G 3/065; G01C 3/08
USPC ................ 250/214 A, 214 R; 356/4.01, 5.01; 330/291, 293, 299, 300, 308
See application file for complete search history.

(56) References Cited

U.S. PATENT DOCUMENTS 3,644,740 A * 2/1972 Dobratz .................... G01J 1/44
250/214 R
4,888,562 A 12/1989 Edler
(Continued)

OTHER PUBLICATIONS

Schilling, Bradley W. et al.; "End-Pumped Monoblock Laser for Eyesafe Targeting Systems"; Report for Night Vision and Electronic Sensors Directorate (NVESD); Nov. 1, 2006; 30 pps; Ft. Belvoir, VA.

*Primary Examiner* — John Lee
(74) *Attorney, Agent, or Firm* — William J. Kubida; Peter J. Meza; Hogan Lovells US LLP

(57) ABSTRACT

A non-saturating receiver design and clamping structure for high power laser rangefinders of especial utility with respect to pumped, monoblock lasers. The receiver comprises a photodiode and a transimpedance amplifier having at least first and second stages. The first stage comprises a field effect transistor and the second stage comprises a non-saturating, non-inverting amplification stage including a differential pair of bipolar transistors having a feedback path coupling the second stage to the input of the first stage. A clamping structure for the receiver comprises a resistor coupling a cathode of the photodiode to a first voltage input and a clamping diode also coupling the cathode to a second lower voltage input. A capacitor having a capacitance $C_s$ couples the cathode of the photodiode to a reference voltage line, wherein the capacitance $C_s$ is greater than the capacitance of the photodiode $C_D$.

8 Claims, 3 Drawing Sheets

(51) Int. Cl.
*H03F 1/34* (2006.01)
*F41G 3/06* (2006.01)
*G01S 7/486* (2006.01)
*G01S 17/10* (2006.01)
*G01S 7/481* (2006.01)
*H03F 3/45* (2006.01)
*H03F 3/08* (2006.01)

(52) U.S. Cl.
CPC ............... *G01S 17/10* (2013.01); *H03F 3/082* (2013.01); *H03F 3/45085* (2013.01); *H03F 3/45475* (2013.01); *F41G 3/06* (2013.01); *H03F 1/342* (2013.01); *H03F 3/165* (2013.01)

(56) References Cited

U.S. PATENT DOCUMENTS

| | | | |
|---|---|---|---|
| 4,939,476 A | 7/1990 | Crawford | |
| 4,954,757 A | 9/1990 | Berwin | |
| 5,216,386 A | 6/1993 | Wyatt | |
| 5,311,353 A | 5/1994 | Crawford | |
| 5,612,779 A * | 3/1997 | Dunne | G01C 3/08 342/134 |
| 5,691,808 A | 11/1997 | Nourrcier, Jr. et al. | |
| 5,696,657 A | 12/1997 | Nourrcier, Jr. et al. | |
| 5,767,953 A * | 6/1998 | McEwan | G01C 3/08 356/5.01 |
| 5,886,581 A | 3/1999 | Hugel et al. | |
| 6,342,694 B1 | 1/2002 | Satoh | |
| 6,445,444 B2 * | 9/2002 | Dunne | G01C 3/08 356/5.01 |
| 6,512,574 B2 | 1/2003 | Lai et al. | |
| 6,720,826 B2 | 4/2004 | Yoon | |
| 6,771,132 B1 | 8/2004 | Denoyer et al. | |
| 6,778,021 B2 | 8/2004 | Denoyer et al. | |
| 6,828,857 B2 | 12/2004 | Paillet et al. | |
| 6,847,263 B2 | 1/2005 | Denoyer et al. | |
| 7,039,087 B2 | 5/2006 | Nettleton et al. | |
| 7,088,179 B2 | 8/2006 | Gilbert et al. | |
| 7,091,793 B2 | 8/2006 | Bardsley et al. | |
| 7,126,382 B2 | 10/2006 | Keil | |
| 7,479,999 B2 | 1/2009 | Akiba | |
| 7,505,696 B2 | 3/2009 | Day | |
| 7,508,497 B2 | 3/2009 | LaBelle | |
| 7,547,889 B2 | 6/2009 | Lehmann et al. | |
| 7,557,333 B2 | 7/2009 | Takahashi et al. | |
| 7,859,651 B2 | 12/2010 | Günther et al. | |
| 8,018,286 B2 | 9/2011 | Christensen | |
| 8,309,926 B2 * | 11/2012 | Borosak | G01S 7/4804 250/338.1 |
| 8,350,206 B2 | 1/2013 | Stutz | |
| 8,362,841 B2 | 1/2013 | Ito et al. | |
| 8,451,432 B2 | 5/2013 | Crawford et al. | |
| 8,509,629 B2 | 8/2013 | Zou et al. | |
| 8,581,168 B2 | 11/2013 | Linder et al. | |
| 8,760,147 B2 | 6/2014 | Lotto et al. | |
| 8,804,101 B2 | 8/2014 | Spagnolia et al. | |
| 9,151,604 B1 * | 10/2015 | Dunne | G01C 3/08 |
| 2001/0012104 A1 * | 8/2001 | Dunne | G01C 3/08 356/5.1 |
| 2002/0033937 A1 * | 3/2002 | Lai | G01C 3/08 356/4.01 |
| 2003/0090326 A1 | 5/2003 | Pogrebinsky et al. | |
| 2003/0183750 A1 | 10/2003 | Akiba | |
| 2005/0046444 A1 * | 3/2005 | Keil | H03K 3/2885 326/84 |
| 2005/0057304 A1 * | 3/2005 | Gilbert | H03F 1/26 330/254 |
| 2005/0062530 A1 * | 3/2005 | Bardsley | H03K 5/082 330/136 |
| 2005/0110976 A1 * | 5/2005 | LaBelle | G01C 3/08 356/5.01 |
| 2006/0034620 A1 | 2/2006 | Day | |
| 2006/0034622 A1 | 2/2006 | Day | |
| 2006/0202765 A1 | 9/2006 | Gan et al. | |
| 2006/0238254 A1 | 10/2006 | Gilbert et al. | |
| 2007/0212081 A1 * | 9/2007 | Takahashi | H04B 10/66 398/202 |
| 2008/0224054 A1 * | 9/2008 | Lehmann | G01T 1/2018 250/370.01 |
| 2008/0290952 A1 | 11/2008 | Pless | |
| 2009/0079958 A1 * | 3/2009 | Gunther | G01S 7/481 356/5.01 |
| 2009/0095883 A1 | 4/2009 | Akiba | |
| 2009/0110409 A1 * | 4/2009 | Zou | H03F 3/082 398/208 |
| 2010/0189140 A1 | 7/2010 | Nettleton et al. | |
| 2010/0214019 A1 * | 8/2010 | Christensen | H03F 1/26 330/252 |
| 2010/0264301 A1 * | 10/2010 | Borosak | G01S 7/4804 250/252.1 |
| 2011/0017904 A1 * | 1/2011 | Stutz | H04B 10/693 250/216 |
| 2011/0227632 A1 * | 9/2011 | Lotto | G01T 1/17 327/509 |
| 2011/0241777 A1 * | 10/2011 | Ito | H03F 3/45089 330/252 |
| 2012/0140201 A1 | 6/2012 | Grauslys et al. | |
| 2012/0248288 A1 * | 10/2012 | Linder | F41G 7/008 250/208.1 |
| 2013/0070239 A1 * | 3/2013 | Crawford | G01S 17/66 356/139.04 |

* cited by examiner

NON-SATURATING RECEIVER DESIGN AND CLAMPING STRUCTURE FOR HIGH POWER LASER BASED RANGEFINDING INSTRUMENTS

RELATED APPLICATION

The present application relates to and claims the benefit of priority to U.S. patent application Ser. No. 13/267,395 filed Oct. 6, 2011, which is hereby incorporated by reference in its entirety for all purposes as if fully set forth herein.

BACKGROUND OF THE INVENTION

The present invention relates, in general, to the field of laser based rangefinding instruments. More particularly, the present invention relates to a non-saturating receiver design and clamping structure for high power laser rangefinders of especial utility in conjunction with monoblock laser based designs.

The United States Army Night Vision and Electronic Systems Directorate (NVESD) has developed pumped, solid state laser based devices that emit eyesafe, electromagnetic radiation in the infrared spectra for, inter alia, determining the range to a target. Such devices are an important component in the acquisition of accurate targeting information.

However, due to the applications in which such devices are employed, it is vital that they be made as small, low cost, light weight and efficient as possible. Because the most expensive part of such a system is the laser transmitter, NVESD has developed what is known as a "monoblock" laser comprising precision cut and coated crystals in the form of a laser resonator. An exemplary monoblock laser is described and illustrated in: Shilling, B. W. et al.; "End-Pumped Monoblock Laser for Eyesafe Targeting Systems", US Army RDECOM CERDEC, NVESD, Ft. Belvoir, Va. available at: http://www.dtic.mil/cgi-bin/GetTRDoc?Location=U2& doc=GetTRDoc.pdf&AD=ADA480960.

Additional description of pumped lasers is given in U.S. Pat. No. 7,039,087 for "End Pumped Slab Laser Cavity" issued May 2, 2006 and United States Patent Application Publication 2010/0189140 for "Laser Diode End-Pumped Monoblock Laser" published Jul. 29, 2010. The disclosures of the foregoing paper and patent documents are herein specifically incorporated by this reference in their entirety.

Laser rangefinding devices incorporating such pumped lasers emit pulsed signals of approximately 6.0 or more millijoules with pulse widths of about 8.0 nanoseconds which corresponds to a peak power output of 750 kilowatts. This corresponds to conventional diode-based laser rangefinders which have a peak power output of from about 10 to 50 watts. The difficulty with such high powered pumped laser devices is that the returned signal easily saturates the associated receiver. For example, reflecting such a pumped laser signal off a blade of grass 10 meters away can result in a return signal of 50 milliamps which is 1,000,000 times the receiver detection threshold of 50 nanoamps causing severe saturation problems.

What is required then is a receiver design and clamping structure wherein the photodiode is capable of absorbing a massive hit of energy and yet the whole system recovers very quickly to enable the detection of a subsequent target. As an example, if the detection threshold of the photodiode is 50 nanoamps a rapid overload recovery is needed from a signal $10^6$ times greater or 50 ma. Currently, conventional monoblock laser receiver designs are extremely complicated, incorporating multi-stacked hybrid devices which are concomitantly expensive to design and produce. Current receivers have had to incorporate variable gain circuits, clamping systems and other techniques in an attempt to solve the inherent saturation issues.

SUMMARY OF THE INVENTION

The present invention advantageously provides a non-saturating receiver design and clamping structure for high power laser based rangefinding instruments which solves the receiver saturation issues attendant their use in conjunction with high power laser devices. The design disclosed herein utilizes relatively inexpensive, commercially available, light weight, and power efficient components without the need for complicated hybrid devices. In operation, the receiver design of the present invention provides a system which is inherently non-saturating along with a very quick recovery time on the order of just a few nanoseconds.

Particularly disclosed herein is a laser rangefinder receiver which comprises a photodiode for detecting laser energy and a transimpedance amplifier coupled to the photodiode. The transimpedance amplifier comprises at least first and second stages with the first stage comprising a field effect transistor having a gate terminal coupled to the photodiode and the second stage comprising a non-saturating, non-inverting amplification stage. In a particular embodiment disclosed herein, the second stage comprises a differential pair of bipolar transistors having a feedback path coupling the second stage to the input of the first stage.

Also particularly disclosed herein is a clamping structure for a laser rangefinder receiver which comprises a photodiode having a capacitance $C_d$ for detecting laser energy, with the photodiode having an anode terminal coupled to an input of a transimpedance amplifier. A resistor couples a cathode of the photodiode to a first voltage input and a clamping diode also couples the cathode to a second voltage input. A capacitor having a capacitance $C_s$ couples the cathode of the photodiode to a reference voltage line. The capacitance $C_s$ is greater than the capacitance $C_d$ of the photodiode.

The receiver design of the present invention is non-saturating in operation and also provides exceptionally quick recovery from a return laser pulse as soon as the light pulse reflected from a target and detected by the photodiode has gone away. Through the use of a novel and inexpensive clamping circuit in accordance with the present invention much faster visibility of a subsequent pulse is provided following a severe overload by rapidly re-establishing the bias on the photodetector back to its operating point. At this stable operating point where there is no voltage change (dv/dt) in the circuit and, since there is no dv/dt, there is also no current flowing through the photodiode that would otherwise appear to the receiver to be a signal coming from a target.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
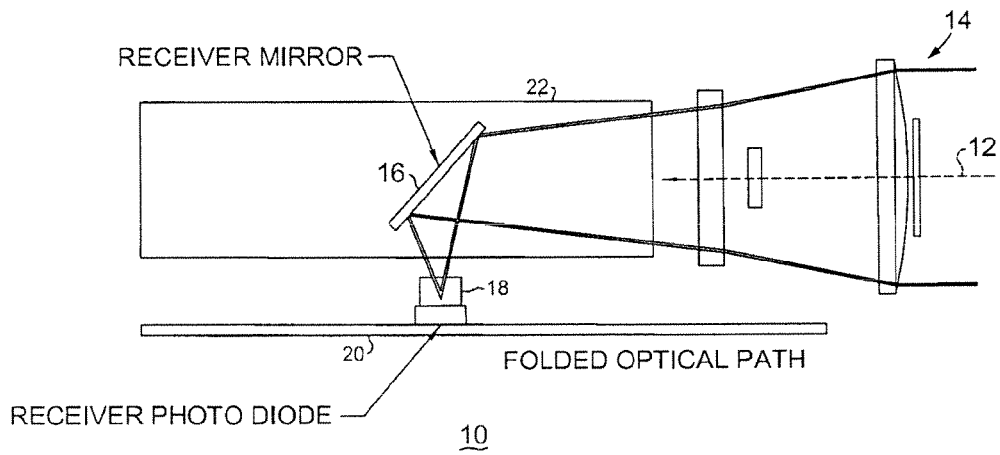
FIG. 1 is a simplified, side elevational view of the receiver portion of a rangefinding device in accordance with an embodiment of the present invention implemented in conjunction with a monoblock laser and a folded optical receive path.

With reference now to FIG. 1, a simplified, side elevational view of the receiver 10 portion of a rangefinding device in accordance with an embodiment of the present invention is shown. The receiver 10 receives laser signals which have been reflected by a target as emitted by an associated monoblock laser transmitter 22.

The reflected laser signals are received along a receive path 12 through receiver optics 14 comprising a series of collimating lenses as illustrated. In the folded optical path configuration shown, the reflected laser signals are directed toward a receiver mirror 16 and then redirected 90° toward a receiver photodiode 18 affixed to a circuit board 20.

Figure 2:
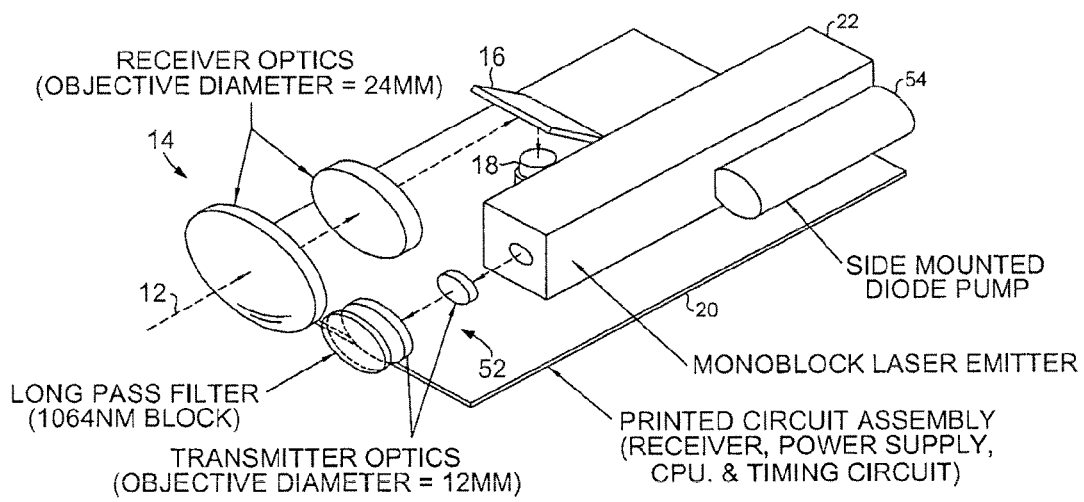
FIG. 2 is a more detailed, isometric view of additional portions of the rangefinding device of the preceding figure illustrating the printed circuit assembly containing the central processing unit (CPU), timing circuit, power supply and receiver portion of the present invention.

With reference additionally now to FIG. 2, a more detailed, isometric view of additional portions of the rangefinding device of the preceding figure is shown. Structure and elements previously described with respect to the preceding figure are like numbered and the foregoing description thereof shall suffice herefor. It should be noted that the circuit board 20 will, in addition to the photodiode 18 and the associated electronic elements of the receiver 10 which will be described in more detail hereinafter, also contain the rangefinder's central processing unit (CPU), timing circuit and power supply (not shown).

The rangefinding device 50 comprises transmitter optics 52 for directing the laser signal from the monoblock laser transmitter 22 toward a target towards which the device is aimed. A diode pump 54 is associated with the transmitter 22.

Figure 3:
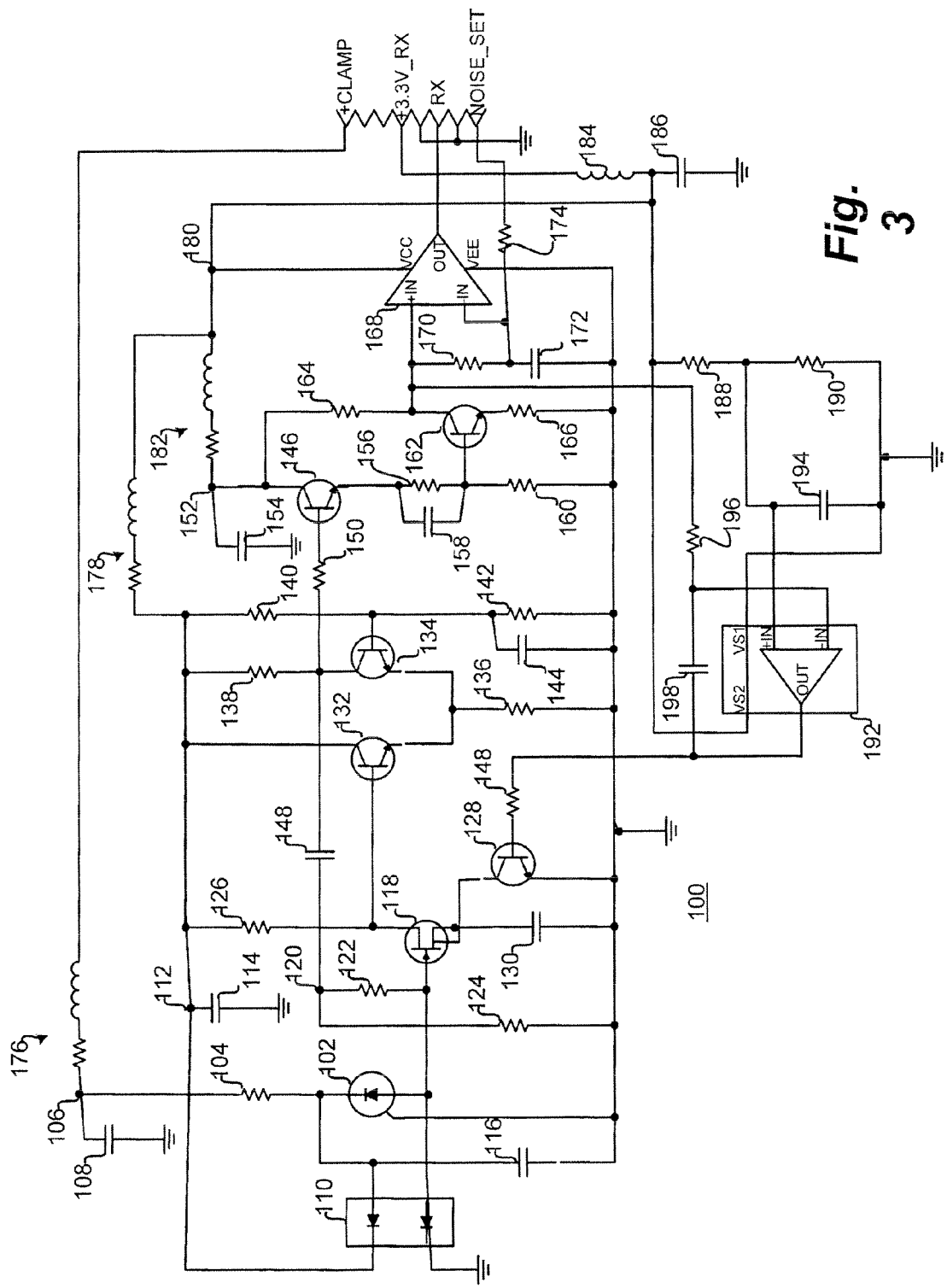
FIG. 3 is a representative schematic of a non-saturating receiver design for possible use with the rangefinding device of the preceding figures.

With reference additionally now to FIG. 3, a representative schematic of a non-saturating receiver 100 design is shown for possible use with the rangefinding device of the preceding figures. The receiver design comprises, in pertinent part an avalanche photodiode 102 for receiving laser energy reflected back to the laser rangefinder from a target towards which it is aimed. The photodiode 102 may comprise, in a representative embodiment, an FCI-InGaAS-120 device available from OSI Optoelectronics. The photodiode 102 has its cathode terminal coupled through resistor 104 to a node 106 which is coupled to circuit ground through capacitor 108.

An associated clamping structure 110 may comprise an HSMS-282K Schottky barrier unconnected diode pair device available from Avago Technologies. One of the diode pair of the clamping structure 110 has its anode coupled to the cathode of the photodiode 102 and its cathode coupled to node 112 which is coupled to circuit ground through capacitor 114. The other of the diode pair of the clamping structure 11o has its anode coupled to the anode of the photodiode 102 and its cathode coupled to circuit ground as shown. The cathode of the photodiode 102 is also coupled to circuit ground through capacitor 116.

A field effect transistor (FET) 118 has its gate terminal coupled to the anode of photodiode 102 and may comprise, in a representative embodiment, an NE3509M04 hetero junction FET. A node 120 is formed intermediate series connected resistors 122 and 124 which also couple the gate terminal of FET 118 to circuit ground. A resistor 126 couples the drain terminal of FET 118 to node 112 while an NPN transistor 128 has its collector terminal coupled to the source of FET 118 and its emitter terminal coupled to circuit ground. A capacitor 130 also couples the source terminal of FET 118 to circuit ground as shown.

An NPN transistor 132 has its collector terminal coupled to node 112 and its emitter terminal connected to the emitter terminal of a similar NPN transistor 134 which are both coupled to circuit ground through a resistor 136. The base terminal of transistor 132 is coupled to the source terminal of FET 118. The collector terminal of transistor 134 is coupled though resistor 138 to node 112 while its base terminal is also coupled to node 112 through resistor 140 as well as to circuit ground through the parallel connected resistor 142 and capacitor 144.

An NPN transistor 146 has its base terminal coupled to node 120 through series connected capacitor 148 and resistor 150, with the node intermediate the two devices being connected to the collector of transistor 134. The collector of transistor 146 at node 152 is coupled to circuit ground through capacitor 154. The emitter terminal of transistor 146 is coupled to circuit ground through a parallel connected resistor 156 and capacitor 158 in series with a resistor 160. The node intermediate resistors 156 and 160 is connected to the base terminal of an NPN transistor 162 which has its collector terminal coupled to the collector of transistor 146 through resistor 164 and its emitter terminal coupled to circuit ground through resistor 166. In a representative embodiment of the present invention, the transistor 128 may comprise an MMBT3904T NPN epitaxial silicon transistors available from Fairchild Semiconductor Corporation while transistors 132, 134, 146 and 162 may comprise BFM505 Dual NPN wideband transistors available form NXP B.V.

A comparator 168 has its non-inverting (+) input coupled to the collector terminal of transistor 162 and its inverting (−) input coupled to the node intermediate series connected resistor 170 and capacitor 172. These series connected devices couple the + input of the comparator 168 to circuit ground and a resistor 174 couples a NOISE_SET signal to the − input of the comparator 168 as shown. In a representative embodiment, the comparator 168 may comprise an ADCMP600, single-supply TTL/CMOS comparator available from Analog Devices, Inc.

Series connected resistor and inductor 176 couple a BIAS signal to node 106 while a similar resistor and inductor group 178 couple node 180 at the supply voltage input of the comparator 168 to node 112. Another similar resistor and inductor group 182 couple node 180 to node 152 as illustrated. An inductor 184 couples a +3.3V_RX supply voltage to node 180 coupled to the supply terminal (VCC) of the comparator 168 while a capacitor 186 couples it to circuit ground. The ground terminal of the comparator 168 (VEE) is also connected to circuit ground as shown. In a preferred embodiment of the present invention, each of the inductors may comprise HZ0402A601R-10 devices available from Laird Technologies.

Node 180 is coupled to circuit ground through the series connected resistors 188 and 190 while the node intermediate the two devices is coupled to the +IN input of an amplifier 192 which is, in turn coupled to circuit ground through capacitor 194 in parallel with resistor 190. The collector terminal of transistor 162 is coupled to the −IN input of amplifier 192 through resistor 196 and through capacitor 198 to the base terminal of transistor 128 through resistor 200. The output (OUT) of the amplifier 192 is also coupled through resistor 148 to the base terminal of transistor 128. The negative supply terminal of the amplifier 192 is connected to circuit ground while the positive supply terminal is connected to node 180. In a representative embodiment of the present invention to the amplifier 192 may comprise a FAN4931 rail-to-rail I/O CMOS amplifier available from Fairchild Semiconductor Corporation. Output (RX) of the receiver 100 circuit is taken at the output (OUT) of the comparator 168.

Functionally, field effect transistor devices, such as FET 118, exhibit essentially zero current noise, having only voltage noise and this inherently provides advantages for high-bandwidth applications over those of a bipolar device. Such devices operate at a high bias level and with very high bandwidth. Together, FET 118 and transistors 132 and 134 operate as a non-saturating transimpedance amplifier wherein the feedback is taken from the collector of transistor 134 (ignoring for the moment capacitor 148) through resistor 122 to the gate of FET 118. The combination of transistors 132 and 134 provide a non-inverting voltage gain to FET 118 in order to make the transimpedance amplifier work with a large enough value of resistor 122, which in a representative embodiment is approximately 33.2K ohms. Thus, the combination of devices illustrated provides a low-noise front end first stage and a controlled gain amplifier second stage which feeds back and forms a transimpedance amplifier.

Further, a non-inverting gain is required from the output of the second stage back to the gate. The differential pair of transistors 132 and 134 provide both a controlled boosting gain bandwidth and a low impedance input desirable in a transimpedance configuration in addition to being non-saturating due to its long-tailed pair configuration. Transistor 128 forms a biasing network for FET 118 in a common source configuration feeding a long-tail pair of bipolar transistors 132, 134 wherein the non-inverting output of the long-tail pair is fed back by capacitor 148 and resistor 122 to the input. Capacitor 148 in the feedback path is not absolutely necessary but convenient and allows for the use of a single rail power supply instead of separately supplying a negative bias source.

The second stage amplifier increases the gain to provide a good working signal voltage for the comparator 168. The comparator 168 requires a minimum amount of gain and the lower the noise level on the front end, the more gain is required on the back end. Therefore, it's desirable to have more gain so that the operating threshold of the comparator above the noise floor is on the order of, for example, 20 millivolts, not 3 millivolts. In the embodiment illustrated, it should be noted that using differential output stages instead of a single-ended stage may provide benefits with respect to bidirectional saturation without departing from the scope of the present invention.

Figure 4:
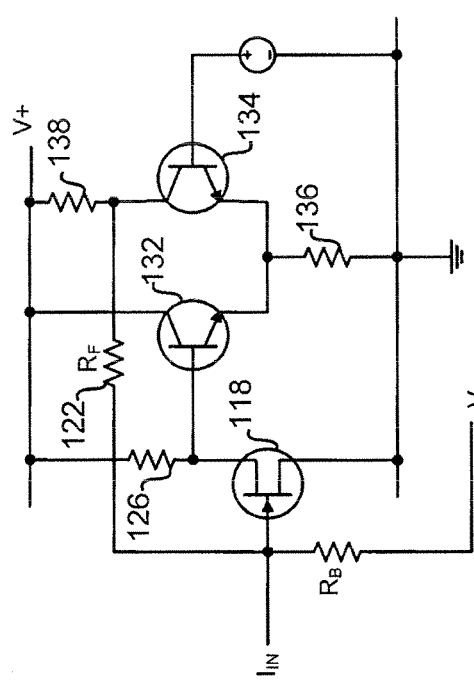
FIG. 4 is a simplified schematic diagram of a portion of the transimpedance amplifier of the preceding figure including a first stage comprising a field effect transistor and a second stage comprising a non-saturating, non-inverting amplifier made up of a differential pair of NPN bipolar transistors.

With reference additionally now to FIG. 4, a simplified schematic diagram of a portion of the transimpedance amplifier of the preceding figure is shown including a first stage comprising a field effect transistor and a second stage comprising a non-saturating, non-inverting amplifier made up of a differential pair of NPN bipolar transistors. In this figure, like structure to that previously described is like numbered and the foregoing description thereof shall suffice herefor. For sake of simplicity, the gate of FET 118 is shown as being coupled to a potential of V− through resistor $R_B$ (bias resistance) and its drain terminal being coupled directly to circuit ground instead of through capacitor 130 and transistor 128 (FIG. 3).

Also, for purposes of this functional illustration, capacitor 148 (FIG. 3) has been eliminated and resistor 122 labeled as $R_F$ (feedback resistance). An input current $I_{IN}$ is shown as being applied to the gate terminal of the FET 118 from the anode of the photodiode (not shown) and output will be taken at the collector terminal of transistor 134. The value of resistance $R_B \gg R_F$. A typical current through FET 118 is 10.0 ma. with current through resistor 138 of 2.5 ma. and through resistor 136 of 5.0 ma.

Figure 5:
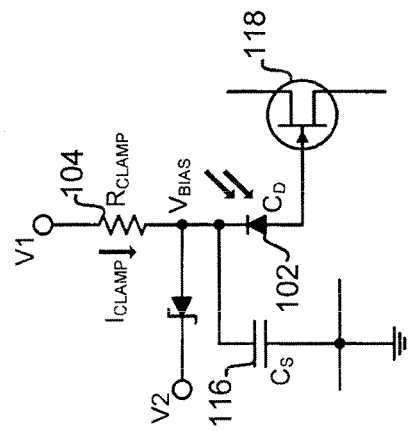
FIG. 5 is a simplified schematic diagram of the clamping structure of FIG. 3.

With reference additionally now to FIG. 5, a simplified schematic diagram of the clamping structure of FIG. 3 is shown. In this figure as well, like structure to that previously described is like numbered and the foregoing description thereof shall suffice herefor. In this figure, resistor 104 is also labeled as $R_{CLAMP}$ (clamping resistance) capacitor 116 is labeled as $C_S$ (speed-up capacitance) and the capacitance of the photodiode 102 is labeled as $C_D$ (diode capacitance).

A known problem with photodiodes, including both PIN and higher voltage avalanche photodiodes (APDs) is that when hit with a very strong light pulse they can conduct momentarily with very, very large currents in the range of amps and, depending on the bias voltage, easily in the range of several hundred milliamps. Without some current limiting circuitry they can easily self-destruct and become a short circuit. For that reason, a current limiting resistor, a constant current source or some other means of limiting the peak steady state current through the device is required. The addition of resistor 104 is then needed but it also has the effect of slowing down operation and adding to the photodiode 102 noise. For this reason, capacitor 116 is then added to speed up operation.

Functionally, when the photodiode 102 gets hit with a light pulse, the light pulse is turned into a current pulse in the photodiode and some amount of charge is pulled out of the speed-up capacitor 116 ($C_S$). The voltage on capacitor 116 then falls in direct relationship to the magnitude of the pulse. However, the charge current has to recharge this capacitance $C_S$, and to do so quickly in on the order of 200 nanoseconds.

As an example, with approximately 10 milliamps of recharge current ($I_{CLAMP}$) through resistor 104 ($R_{CLAMP}$) about 9.9 milliamps would flow through capacitor 116 with 100 microamps through the capacitance $C_D$ of photodiode 102. Therefore, about 1% of the current that is flowing into the transimpedance amplifier is perceived as being a stretched-out light signal rendering the amplifier incapable of recovering until the current flow stops. The value of capacitor 116 cannot be increased beyond a certain limit as the energy stored in it would become too great and cause the photodiode 102 to self-destruct when a large current pulse is encountered. Typically a value of between 1 nanofarad and 100 picofarads may be utilized with PIN photodiodes while a range of 100 to 200 picofarads can be used with APDs.

In operation, the recovery time ($T_{REC}$) needs to be as low as possible. For purposes of illustration, assume a detection threshold of 50 nanoamps, a peak recharge current of 20 milliamps, $C_S$ is 100 pf and $C_D$ is 1 pf. Also, assume V1 is approximately 20.0 volts with V2 being approximately 17.6 volts, giving $V_{BIAS}$ approximately 18 volts with $R_{CLAMP}$ at 1K ohms. The current ($I_{CLAMP}$) through resistor $R_{CLAMP}$ is 2.0 ma. Therefore, since $C_S \gg C_D$, the time constant ("T") is essentially equal to 1K ohms times 100 pf, or 100 nsec. Using these values, the clamp structure recovery time ($T_{REC}$) without a catch diode 110 (FIG. 3) is:

$$T_{REC} = T * \ln[(20\ ma/50\ na)*(C_D/(C_S+C_D))] = 8.3T = 830\ ns.$$

Utilizing the catch diode 110 however, the clamp structure recovery time is over three times quicker and is given as:

$$T_{REC} = T * \ln(20\ ma/2\ ma) = 2.3T = 230\ ns.$$

Stated another way, with the clamp circuit of the present invention since V2 is less than V1, the current flowing through the clamp diode 110 is on the order of 2 milliamps for a maximum of 20 milliamps peak recharge current. As the system recharges, it charges back toward V1 but when it intersects V2, it gets clamped. Once it hits this clamp point, the voltage is no longer changing, which means there is no current in capacitor $C_S$, which also means there is no current in the diode capacitance $C_D$. With only 2 milliamps of clamping current, the time it takes to get to the clamp point at which the change of voltage goes to zero and therefore, there is no current flowing through the capacitor, is only a difference of between 20 milliamps and 2 milliamps, which equates to 2.3 time constants T or 230 ns.

While there have been described above the principles of the present invention in conjunction with specific circuitry and embodiments it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A clamping structure for a laser rangefinder receiver comprising:
    a photodiode for detecting laser energy having a capacitance $C_d$, said photodiode having an anode coupled to an input of a transimpedance amplifier;
    a resistor coupling a cathode of said photodiode to a first voltage input;
    a clamping diode coupling said cathode of said photodiode to a second voltage input; and
    a capacitor having a capacitance $C_s$ coupling said cathode of said photodiode to a reference voltage line, wherein capacitance $C_s$ is greater than capacitance $C_d$,
    wherein said transimpedance amplifier comprises at least first and second stages said first stage comprising a field effect transistor having a gate terminal thereof coupled to said anode of said photodiode and said second stage comprising a non-saturating, non-inverting amplification stage.

2. The clamping structure of claim 1 wherein capacitance $C_s$ is substantially greater than capacitance $C_d$.

3. The clamping structure of claim 1 wherein a voltage applied to said first voltage input is greater than a voltage applied to said second voltage input.

4. The clamping structure of claim 1 wherein said second stage of said transimpedance amplifier comprises a differential pair of first and second bipolar transistors having respective collector terminals thereof coupled to a supply voltage line and respective emitter terminals thereof coupled to said reference voltage line.

5. The clamping structure of claim 4 further comprising:
    a feedback resistor coupling said collector terminal of said second bipolar transistor to said gate terminal of said field effect transistor.

6. The clamping structure of claim 1 further comprising:
    a laser signal transmitter associated with said laser rangefinder receiver.

7. The clamping structure of claim 6 wherein said laser signal transmitter comprises a pumped laser.

8. The clamping structure of claim 7 wherein said pumped laser comprises a monoblock laser.

* * * * *